Nov. 30, 1965 C. L. EADS 3,221,288

PRINTED CIRCUIT CONNECTOR

Filed Sept. 17, 1962 3 Sheets-Sheet 1

INVENTOR.
CHARLES L. EADS

BY Naylor & Neal

ATTORNEYS

Nov. 30, 1965 C. L. EADS 3,221,288

PRINTED CIRCUIT CONNECTOR

Filed Sept. 17, 1962 3 Sheets-Sheet 2

INVENTOR.
CHARLES L. EADS
BY
Naylor & Neal
ATTORNEYS

Nov. 30, 1965 C. L. EADS 3,221,288

PRINTED CIRCUIT CONNECTOR

Filed Sept. 17, 1962 3 Sheets-Sheet 3

INVENTOR.
CHARLES L. EADS
BY
Naylor & Neal
ATTORNEYS 3,221,288

PRINTED CIRCUIT CONNECTOR

Charles L. Eads, North Hollywood, Calif., assignor, by mesne assignments, to Eads Connector Corporation, San Francisco, Calif., a corporation of California Filed Sept. 17, 1962, Ser. No. 223,927
13 Claims. (Cl. 339—176)

This invention relates to printed circuit connectors and more particularly to a connector assembly adapted to receive a printed circuit board and electrical terminals positively locked in the connector.

The widespread use of printed circuit components in electronic equipment has led to the use of printed circuit connectors which receive one end of a printed circuit board and make electrical contact between a multiplicity of conductor strips on the board and a corresponding multiplicity of electrical terminals or lead wires. While a wide variety of these printed circuit connectors have been developed, they all suffer from one or more serious disadvantages, which it is the purpose of this invention to avoid.

Thus, it is a principal object of this invention to provide a printed circuit connector in which the electrical terminals are positively locked and cannot become physically or electrically disconnected from the connector even when the connector is subjected to severe vibration and large impact loads.

It is another object of the invention to provide such a printed circuit connector which can be used very easily and which can be reused easily many times.

It is another object of the invention to provide such a printed circuit connector in which selected electrical terminals can be changed very easily when a printed circuit board is not received in the connector but in which the electrical terminals cannot be removed either accidentally or intentionally when a printed circuit board is received in the connector.

It is another object of this invention to provide such a printed circuit connector in which the multiplicity of electrical terminals or leads can be supported in alternative locked and unlocked condition and in which the sole act of inserting a printed circuit board into the connector will effect conversion from the unlocked condition to the locked condition.

It is another object of the invention to provide such a printed circuit connector which is constructed to positively prevent contact between adjacent electrical terminals or leads even when the connector is subjected to severe vibration or individual terminals are bumped.

It is another object of the invention to provide such a printed circuit connector which can be manufactured easily and economically and which will not require component parts or manufacturing techniques of excessive precision or complexity.

Other objects and advantages of the invention will become apparent from the following description read in conjunction with the attached drawings in which.

Figures 1, 2:
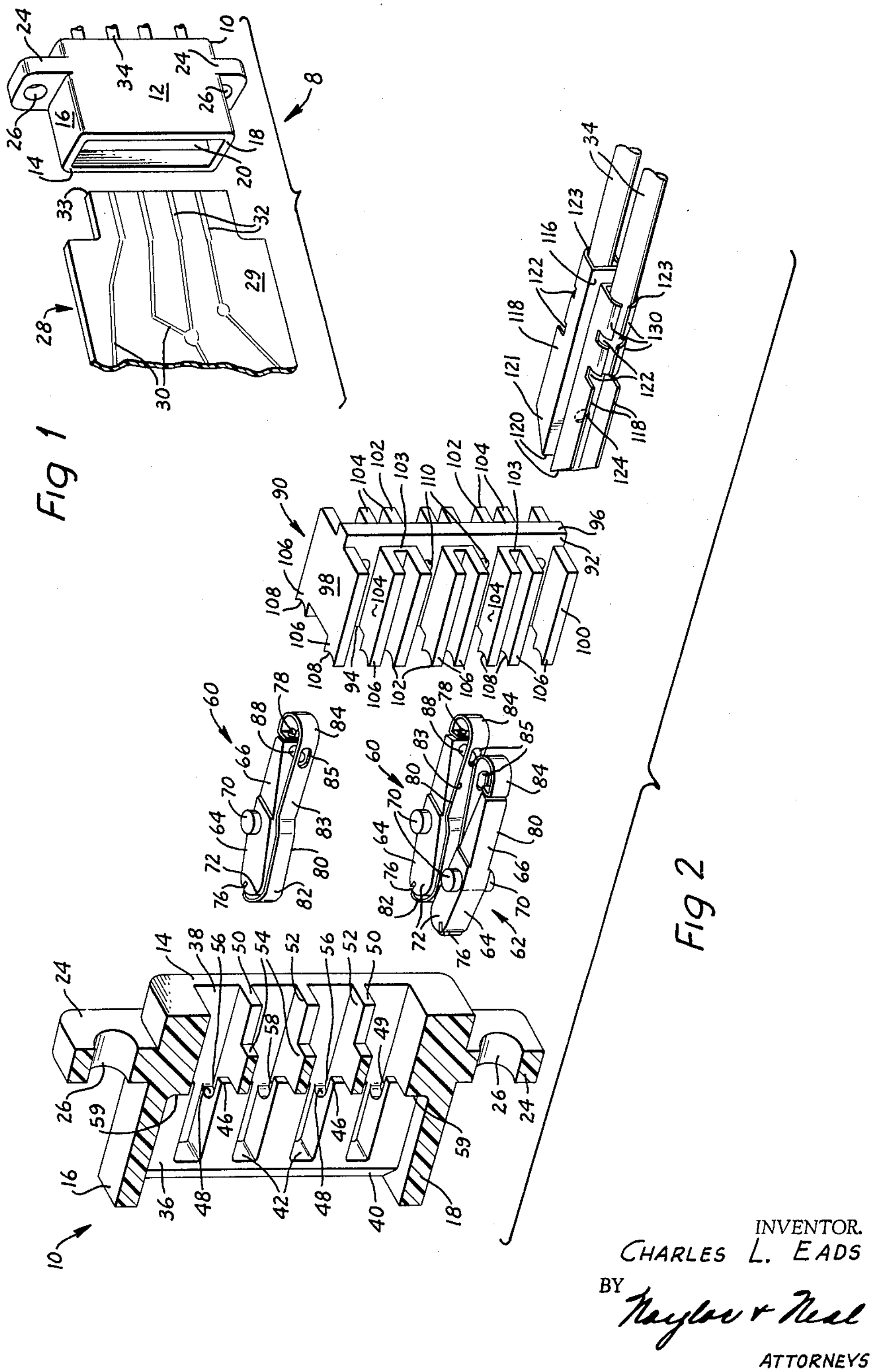
FIG. 1 is a diagrammatic view in perspective, showing a connector of the invention, and a printed circuit board in position for insertion therein.
FIG. 2 is an enlarged and exploded view in perspective, being somewhat diagrammatic and partially in section, illustrating the elements of the connector of FIG. 1.
Figures 3, 5:
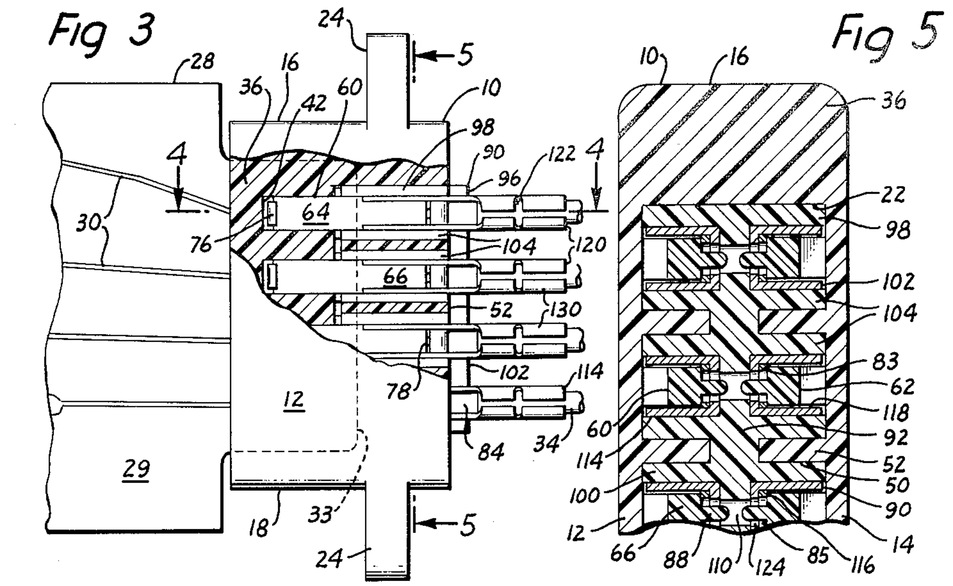
FIG. 3 is a top plan view of the connector of FIG. 1, being partly in section, and having a printed circuit board inserted therein.
FIG. 5 is a further enlarged fragmentary section taken along the lines 5—5 of FIG. 3.

Referring to the drawings, and particularly to FIG. 1, a guide lock connector 8, in accordance with the invention is shown. The connector 8 includes a body or case 10, which is generally hollow and of rectangular cross section. The body or case 10 is constructed of a non-ductive clear plastic, preferably of the epoxy type. The body or case 10 provides opposite side walls 12 and 14; opposite end walls 16 and 18; a front opening or cavity 20; and a rear opening or cavity 22 (best seen in FIGS. 4, 5 and 6). Two mounting ears 24, each having a circular opening 26 therethrough, project from the end walls 16 and 18, respectively (see also FIG. 2).

The case 10 is adapted to receive a printed circuit board 28, through the front opening 20. The printed circuit board is of conventional design, and bears on each side 29 thereof a number of metal strips 30, adapted to form part of a circuit; and a number of contacts 32 uniformly spaced along the forward edge 33 of the board 28. As will be more fully described below, the connector 8 is adapted to interconnect the strips 30 and contacts 32 with wires 34 positioned at the rear opening 22 of the case 10.

Each of the side walls 12 and 14 of the case 10 has a comparatively thick section 36 adjacent the front opening 20; and a comparatively thin section 38 adjacent the rear opening 22. Each thick sidewall section 36 is provided with a beveled edge 40 at the front opening 20, to facilitate the insertion of the printed circuit board 28. Four recesses 42 are formed in each of the thick side wall sections 36; said recesses 42 being equally spaced longitudinally of the case 10, and extending from the rearward end 46 of the respective section 36 to a point adjacent the front opening 20. Cut into each thick side wall section are three grooves (not shown), each being positioned intermediate a pair of adjacent recesses 42, and paralleling the latter. Each groove is open at its forward end; i.e., at the front opening 20, and adapted for the insertion of conventional plastic polarizing tabs. One tab may be inserted in one pair of opposite grooves, and is adapted to be received in a corresponding slot (not shown) in the forward edge 33 of the printed circuit board 28. Said polarizing tabs serve to properly locate the printed circuit board 28 for insertion in the case 10. It will be realized that the recesses 42 and the aforementioned grooves in the side wall sections 36 of the side walls 12 and 14 have corresponding, opposed positions. Cut into the rearward end 46 of each thick side wall section 36 are three rounded seats 48, each positioned between a pair of adjacent recesses 42 and opening into the latter, and two rounded seats 49 (only one being seen), positioned adjacent the end walls 16 and 18, respectively, and each opening into the adjacent recess 42.

Three somewhat "H" shaped partitions 50 extend between the side walls 12 and 14 of the case 10, and from the rear opening 22 to the rearward ends 46 of the thick side wall sections 36. Each partition 50 is located intermediate a pair of adjacent recesses 42, and provides two outer legs 52 adjacent the rear opening 22; a cross-piece 54 straddling the opposed rearward ends 46 of the thick side wall sections 36; and three comparatively short forward legs 56. Each leg 56 extends into one of the rounded seats 48; and at its distal end is formed with a rounded depression 58, the latter cooperating with the respective seat 48 to form in effect a generally circular bore. Each end wall 16 and 18 is thickened adjacent the rear opening 22 so as to form a forwardly-facing shelf 59.

Figure 6:
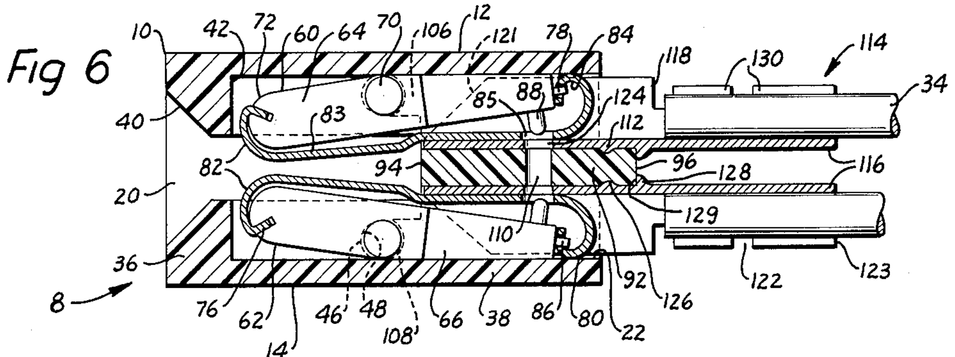
FIG. 6 is a view similar to FIG. 4, but with the printed circuit board having been removed.
Figure 4:
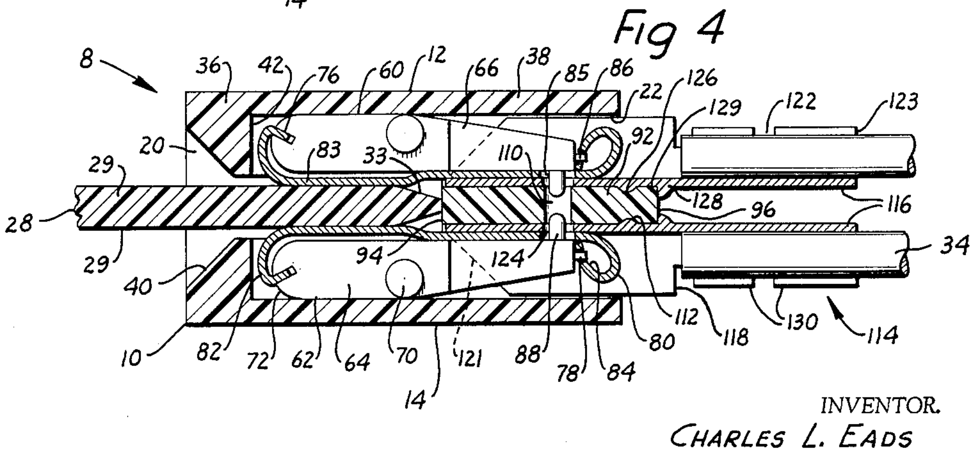
FIG. 4 is a further enlarged vertical section, taken along the plane 4—4 of FIG. 3.

The connector 8 includes a pair of pivoted rocker or locking members 60 and 62, associated respectively with each pair of oppositely-positioned recesses 42 in the thick side wall sections 36 of the opposite side walls 12 and 14 of the case 10. The rocker members 60 and 62 are preferably constructed of a high memory factor-type plastic; e.g., Teflon, nylon, etc. The rocker members 60 and 62 are of identical structure, but are reversely positioned within the case 10 (FIGS. 4 and 6). Each locking member 60 or 62 is of elongate shape, and provides a forward end portion 64 which is adapted for insertion within the respective recess 42; and a rearward end portion 66 which is somewhat inclined inwardly from said forward end portion 64. The end portion 66 is provided with two pivot pins 70, located at the opposite sides thereof, and adapted for seating in the rounded seats 48 (or 49), respectively, located adjacent the rearward end of the respective recess 42. Each locking member forward end portion 64 is rounded at its distal end as shown at 72, and provided with a cleft 76 therein. Each rearward end portion 66 is provided with an outwardly-extending pin 78. A spring contact 80 is associated with each locking member 60 or 62, being constructed of a high conductivity metal alloy (e.g., beryllium-copper, or phosphorus-bronze), preferably plated with gold or silver. Each spring contact 80 is in the form of a strip, having a forward hook-shaped end 82 inserted in the respective cleft 76; a central portion 83 extending generally along the inner surface of the associated locking member 60 or 62; and a rearward end loop 84. Each spring contact 80 is provided with a generally circular opening 85 therethrough, adjacent the respective loop 84; and with a circular opening 86 in said loop 84. The loop 84 of each spring contact 80 is releasably secured to the respective locking or rocker member 60 or 62, through engagement of the loop opening 86 and pin 78. The rearward end portion 66 of each locking member 60 or 62 is provided with an inwardly-projecting locking pin 88, generally aligned with the aforementioned opening 85 of the associated spring contact 80.

A plastic insert web 90 is provided, which is adapted for insertion in the rear opening 22 of the case 10. The insert web 90 provides a flat, rectangular, longitudinally-extending central wall 92. The wall 92 has opposite straight forward and rearward edges 94 and 96; and at its opposite ends merges with two substantially square, flat end walls 98 and 100; the latter extending perpendicularly to said central wall 92. The central wall 92 bears on each side face thereof three channel portions 102; each of the latter having a base 103, and opposite side walls 104. The channel portions 102 are oppositely positioned to one another on the wall 92, and each pair of opposite channel portions 102 corresponds to one of the partitions 50 of the case 10. Each pair of opposite channel bases 103, and the portion of the wall 92 therebetween, are cut away to form a slot (not shown); the latter opening at the forward edge 94 of the wall 92, and extending rearwardly approximately half the distance to the rearward edge 96. Each of the end walls 98 and 100 is provided at its opposite sides with two short, forwardly-extending extension portions 106; each of the latter having a curved recess 108 formed in its distal end. The channel side walls 104 are likewise each provided with a forwardly-extending extension portion 106, having a curved recess 108 therein. Four circular openings 110 are formed in the wall 92, adjacent the rearward edge 96 thereof, and each being positioned between two channel portions 102; or between a channel portion 102 and one end wall 98 or 100. Between said wall openings 110 and the rearward edge 96, the wall 92 is formed on either side thereof with a depression 112 (FIG. 4).

The case 10 is adapted to receive through its rear opening 22, a wire terminal clip 114, corresponding to each of the locking members 60 or 62. Each wire clip 114 is in the form of a channel, having a base 116, and opposite side walls 118. Each of the side walls 118 is, at the forward end 120 of the clip 114, tapered toward the base 116 as seen at 121. Each side wall 118 is provided with two serrations 122, adjacent the rearward end 123 of the clip 114. The base 116 is formed with a circular opening 124 therethrough, located a short distance from the forward end 120. Each base 116 is also provided with a small outwardly-projecting detent 126, located a short distance to the rear of the respective opening 124; and with a projection 128 having a flat forward surface 129, located a short distance to the rear of the detent 126 (FIG. 4).

It will be noted that, as a result of the presence of the serrations 122 in the clip side walls 118, two tabs 130 are formed in each of said side walls 118. One of the wires 34 is inserted in the channel of each of the wire clips 114, at the rearward end 123 thereof, and up to the forward tab 130. The four tabs 130 of each wire clip 114 are crimped over the associated wire 34, in conventional manner, and so as to tightly secure the wire 34 to the wire clip 114.

In assembling the guide lock connector 8 from the elements shown in FIG. 2, the respective forward end portions 64 of each pair of locking members 60, 62 are first inserted in two oppositely-positioned recesses 42 in the case 10, and so that each pivot pin 70 becomes seated in one of the rounded seats 48 or 49, the latter then serving as pivot bearings. As noted before, the oppositely-disposed locking member 60 and 62 of each pair are reversely positioned in the respective recesses 42 (FIGS. 4 and 6), so that each spring contact 80 faces inwardly of the case 10.

The insert member 90 is then inserted through the rear opening 22 of the case 10, while the locking members 60 and 62 are maintained in their open position shown in FIG. 6. As seen most clearly in FIGS. 3 and 5, the end walls 98 and 100 of the insert 90 then become positioned adjacent the end walls 16 and 18, respectively, of the case 10; and each chanel portion 102 grips one of the rearward legs 52 of one of the partitions 50, as well as also gripping a portion of the cross-piece 54 of the latter. The slot between the walls 104 of each channel portion 102 receives therein one of the cross-pieces 54. Each of the end walls 98 and 100 of the insert member 90 abuts the rearward end 46 of a thick side wall section 36 of the case 10. Each of the extension portions 106 of the insert member 90 lies inserted within one of the rounded seats 48 or 59, formed in the rearward end 46 of a thick sidewall section 36. Each locking member 60 or 62 then lies positioned with the locking pin 88 thereof in substantial alignment with one of the circular openings 110 in the wall 92 of the insert member 90.

It should be realized that the insert member 90 is so proportioned as to fit very tightly within the case 10. A wire clip 114 may then be inserted between each pair of adjacent channel portions 102 (or between a channel portion 102 and the wall 98 or 100) the respective tapered end 121 being inserted first. Each wire clip 114 is inserted up to the point at which the detent 126 thereof engages the depression 112 in the adjacent surface of the wall 92 of the insert member 90. At the same time, the projection 128 formed in the base 116 of the wire clip 114 will come into abutment with the rearward edge 96 of the wall 92 of the insert member 90, and will serve as a stop. It will be noted that the circular opening 124 in the wire clip base 116 will then be in registry with one of the circular openings 110 in the insert member wall 92; and will be in alignment with the locking pin 88 of the adjacent rocker member 60 or 62. It will be noted that the loops 84 at the rearward end of the spring contacts 80 normally (i.e., before insertion of a printed circuit board 28), serve to maintain the locking members 60, 62 in the open position shown in FIG. 6.

When a printed circuit board 28 is inserted through the front opening 20 of the case 10, and into the position shown in FIG. 4, pressure is exerted against the forward, hook-shaped ends 82 of the spring contacts 80. The locking members 60 and 62 are, as a result, caused to pivot on their respective pivot pins 70, and in counter clockwise and clockwise directions, respectively, into their closed positions shown in FIG. 4. Each locking pin 88 will then move through the opening 85 of the associated spring contact 80; through the opening 124 of the adjacent wire clip 114; and into one of the openings 110 in the insert member wall 92. When the printed circuit board 28 is fully inserted, its inner edge areas abut the forward edge 94 of the insert member wall 92, and the shelf portions 59 of the end walls 16 and 18 of the case 10.

The printed circuit board 28 is of standard design, and the spring contacts 80 of the invention correspond respectively to the contacts 32 on the opposite surfaces of said printed circuit board 28. Thus, when the printed circuit board 28 is inserted in the case 10, the aforementioned polarizing tabs (not shown) serve to position the board 28 for electrical contact between each contact 32 and the respectively corresponding spring contact 80. Electric current may then flow through each contact 32, the associated spring contact 82, the associated wire clip 114, and the associated wire 34. At the same time, each locking pin 88 locks the associated wire clip 114 to the insert member 90; and consequently positively prevents said clip 114 from loosening responsive to vibration, etc. Although the forward end portions 64 of the pivoted locking members 60 and 62 exert some pressure on the printed circuit board 28 when the latter is in inserted position, said board 28 can be readily removed.

It should be noted that each spring contact 80, in conjunction with the center wall 92 of the insert member 90, provides for spring-tensioned insertion of the associated wire clip 114. Even with the printed circuit board 28 removed, each spring contact rearward loop 84 maintains contact with the base 116 of the associated wire clip 114 thereby holding the clip 114 in place by friction prior to positive locking by the pin 88.

It should be noted that when the printed circuit board 28 is in inserted position, the central portion 83 of each spring contact 80 becomes tightly sandwiched between the associated locking member rearward end portion 66, and the associated clip base 116. This assures the desired passage of current between the spring contact 80 and the wire clip 114. At the same time, each spring contact 80 provides one-hundred percent bearing surface against the associated side 29 of the printed circuit board 28, and therefore assures proper electrical contact with the associated circuit board contact 32. When the printed circuit board 28 is in inserted position, and depending upon the thickness of the latter, each locking member forward end portion 64 may itself be placed under slight compression. This provides additional assurance of proper electrical contact and locking action, despite the normal variations in thickness as between different circuit boards 28 employed. The latter may be expected to vary about .010" from standard thickness. The elements of the connector 8 are so proportioned that such variance equals only about one percent of the distance of travel of each locking member 60 or 62.

It should be noted that the wire clips 114 differ from conventional clips primarily in respect of their channel shape; and in the provision of the circular opening 124 in the channel base 116. If desired, the channel side walls 118 may be of sufficient depth, so that the clip 114 may receive two wires 34.

The case 10, as well as the other plastic elements of the connector 8, may be molded in accordance with conventional practices. The case 10 is preferably of solid construction. The elements of each insert member 90 may be heat sealed together; or sealed together by a bonding coating of resin.

The connector 8 may be designed so as to provide as few as two; or as many as one-hundred or more contacts. Twenty-four or more contacts are normally provided. Each locking member 60 or 62 and associated structure provides a separate contact (e.g., a one-hundred contact connector will have fifty contacts on each side).

Figures 7, 8:
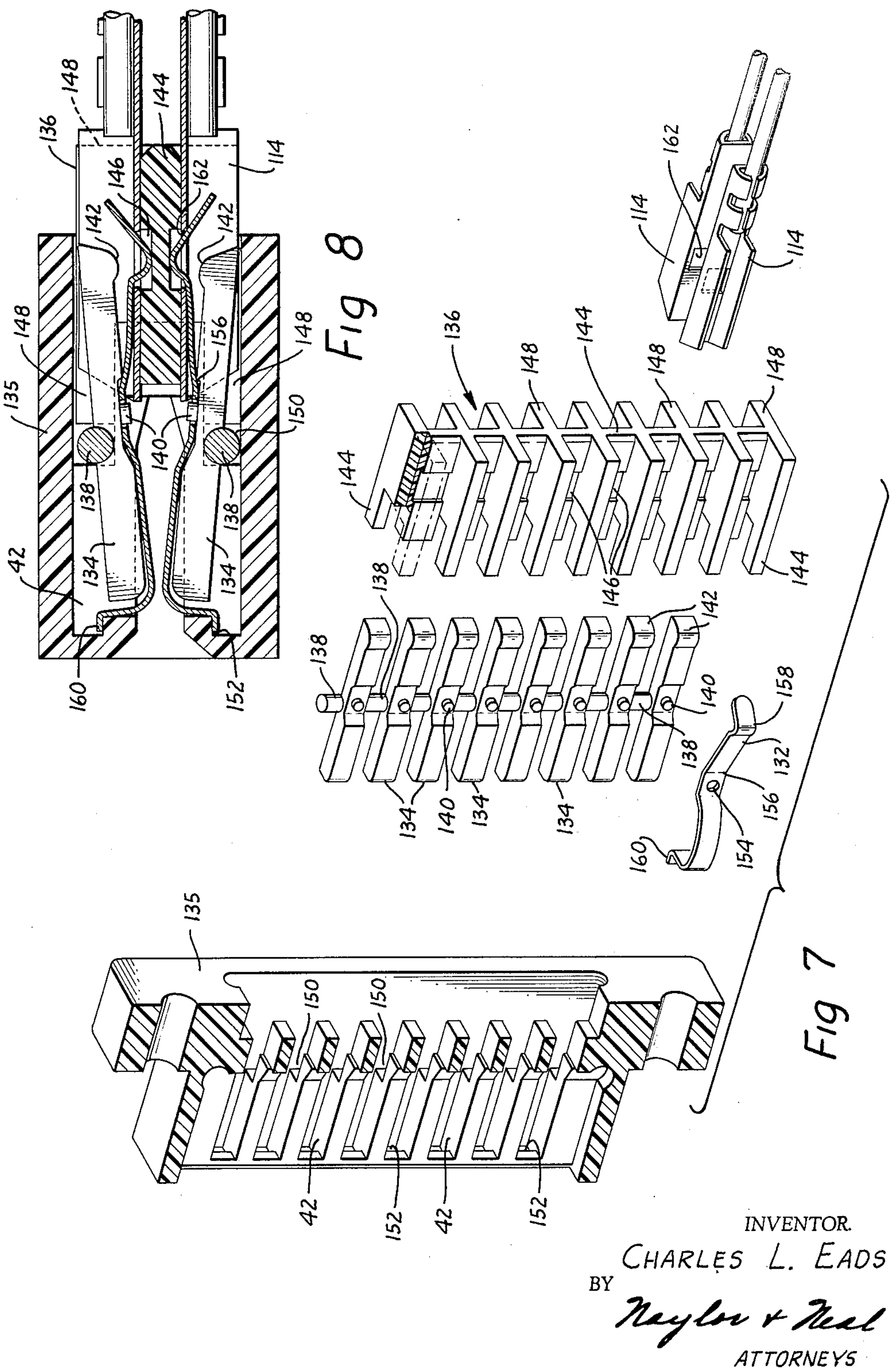
FIG. 7 is an enlarged and exploded view similar to FIG. 2 but showing a different form of printed circuit connector of this invention.
FIG. 8 is a view similar to FIG. 6 but showing a cross section of the form of connector shown in FIG. 7.

The connector illustrated in FIGS. 7 and 8 is similar in many respects to the connector of FIGS. 1–6, but employs spring conductors 132, rocker members 134, a body 135, and a web 136 of different shape from the corresponding members in the connector of FIGS. 1–6. In the connector of FIGS. 7 and 8, the rocker members 134 are connected to each other by cylindrical pivot portions 138. Preferably, the rocker members 134 and pivot portions 138 are formed as an elongated integral strip which may be cut to the desired length for a connector for any desired number of terminals. Each rocker member 134 is provided with a locating pin 140 for positioning one of the spring conductors 132 on the rocker member, and each rocker member has a boss 142 thereon for locking a terminal 136 in the connector as explained below.

The web 136 has a central wall 144 provided with depressions 146 for receiving the bosses 142 on the rockers 134 and lateral arms 148 which divide the web into a plurality of channels for receiving the terminal clips 114. The forward ends of the arms 148 fit into slots 150 between the grooves 42 in the body 135 and engage the pivot portions 138 of the rockers to position the rockers in the body 135. The grooves 42 have undercut lips 152 adjacent to the printed circuit receiving opening of the body 135.

Each of the springs 132 is preferably made as a simple stamping of spring metal and has a central aperture 154 which fits on the pin 140 of one of the rocker members to position the spring 132 on the rocker member, one spring 132 being mounted on each rocker member. As can be best seen in FIG. 8, the spring 132 is shaped to conform generally to the rocker member but is deformed away from the rocker member 134 at a bending plane 156 so that the spring resiliently engages the rocker member 134 and web 136 to the right of the pivot axis 138 thereby resiliently supporting the rockers 134 in the positions shown in FIG. 8. Each spring 132 has at one end a curved portion 158 which seats in a depression 146 in the web 136 and has at the other end a projection 160 which fits under the lip 152 to provide resilient support for that end of the spring and to limit approach of two opposed springs 132 to each other so that they do not contact each other electrically when a printed circuit board is not received in the connector.

The electrical terminal clips 114 have substantially the same shape as the clips in FIGS. 1–6 with the exception that the apertures 162 therein are generally rectangular and the full width of the clip to permit the curved portions 158 of the springs 132 to penetrate the terminals 114 into the depressions 146. The apertures 162 are properly positioned along the length of the terminal 114 so that when the terminal is inserted between the web walls 148 until it engages the body 135, the aperture 162 will register with the depression 146.

The connector of FIGS. 7 and 8 may be assembled by first placing the springs 132 on the integral assembly of rockers 134 with the pins 140 received in the apertures 154. The web 136 may then be supported as a work holder and the spring loaded rocker assemblies mounted thereon after which the assembly of rockers, springs and web may be slid into the body 134. In order to maintain the web 136 in the body 135, a suitable notch may be provided in the body 135 receiving a boss on the web 136 so that the web snaps into place in the body 135.

With the connector thus assembled, the electrical terminals may be inserted into the connector between the walls 148 of the web 136 until the curved portions 158 of the springs 132 penetrate through the apertures 162 in the terminals; in this condition, the terminals 114 are resiliently but removably supported in the connector and can be easily removed and replaced. It should be noted from FIG. 8 that the walls 148 of the web have sufficient length to enclose the terminals 114 substantially completely so that the terminals may not be moved into contact with each other at this side of the connector.

When all of the terminal clips 114 are secured in the connector resiliently in this manner, a printed circuit board may be inserted in the other end of the connector to make electrical contact with the springs 132 and to rock the rocker members 134 about their pivot portions 138. As the rocker members 134 rock, their bosses 142 penetrate the apertures 162 in the terminals 114 and engage the curved portions 158 of the springs 132 to hold them positively in the depressions 146. In this manner, the terminals 114 are positively locked in the connector when the printed circuit board is received therein.

A completely locked assembly can be further insured by locking the printed circuit board in the connector as by a pin extending transversely through the printed circuit board and the body 135, but this is generally unnecessary since the connectors and printed circuit boards are usually mounted in electrical equipment in a manner to prevent relative movement between them.

In order the form of connector shown in FIGS. 7 and 8, a conventional polarizing tab may be mounted in the connector in any suitable way as by mounting it in a blank groove 42 in which no rocker 138 is mounted, or by mounting it in a slot between grooves 42.

While two specific embodiments of the invention have been illustrated and described in detail herein, it is obvious that many changes may be made in the arrangements and details described without departing from the spirit and scope of the invention.

I claim:

1. A printed circuit connector for connection to a printed circuit board which comprises: an insulator body having a first cavity therein for receiving a printed circuit board and a plurality of second cavities for receiving a plurality of electrical terminals electrically connected to said printed circuit board, an electrical terminal removably inserted in each of said second cavities, said terminal having sliding surfaces engaging said body for permitting longitudinal sliding withdrawal of said terminal from said second cavity when said terminal is subjected to a withdrawal force below a predetermined withdrawal force and manually operable latch means in said body movable simultaneously with respect to said body and all of said terminals for simultaneously latching said terminals in said second cavities and preventing longitudinal withdrawal of said terminal when said terminal is subjected to said predetermined withdrawal force.

2. A printed circuit connector for connection to a printed circuit board which comprises: an insulator body having first and second cavities therein for receiving a printed circuit board and a plurality of electrical terminals respectively with the terminals electrically connected to the board, a plurality of electrical terminals removably inserted in said second cavity, said terminals having sliding surfaces engaging said body for permitting longitudinal sliding withdrawal of said terminals from said second cavity when each of said terminals is subjected to a withdrawal force below a predetermined withdrawal force and normally unlatched manually operable latch means in said body for simultaneously latching all of said terminals in said second cavity and preventing longitudinal withdrawal of said terminals when each of said terminals is subjected to said predetermined withdrawal force.

3. An electrical assembly for connection to a printed circuit board which comprises an insulator body having a first cavity therein for receiving a printed circuit board and a plurality of second cavities for receiving a plurality of electrical terminals electrically connected to said printed circuit board, an electrical terminal removably inserted in each of said second cavities, and slidably engaging said body for longitudinal withdrawal from said body through said second cavity and releasable latch means in said body extending between said cavities and movable with respect to said body and said terminal for engaging said terminal and positively latching said terminal in said second cavity when a printed circuit board is received in said first cavity with said latch means having a relaxed shape unlocking said terminal and permitting removal of said terminal from said second cavity when no printed circuit card is positioned in said first cavity.

4. A printed circuit assembly comprising an insulator body having first and second cavities therein for receiving a printed circuit board and an electrical terminal respectively, an electrical terminal removably inserted in said second cavity, a printed circuit board removably inserted in said first cavity and electrically connected to said terminal, and releasable latch means in said body in engagement with said printed circuit board and said terminal and latching said terminal in said second cavity with said latch means slidably engaging said printed circuit board for permitting sliding withdrawal of said printed circuit board from said first cavity and moving in said body for unlatching said terminal responsive to removal of said printed circuit board from said first cavity.

5. A printed circuit board connector comprising an insulator body having first and second cavities therein adapted to receive a printed circuit board and an electrical terminal respectively electrically connected together, and a rocker mounted in said body and extending into said first and second cavities with said rocker mounted for pivotal movement from an unlocking position to a locking position responsive to insertion of a printed circuit board into said first cavity, said rocker having a portion thereof in said first cavity protruding into the path of insertion of a printed circuit board into said first cavity for slidably engaging said board and said rocker having a latch portion thereof movable in said second cavity for positively latching an electrical terminal in said second cavity when said rocker is in said locking position.

6. A printed circuit board connector comprising an insulator body having first and second cavities therein adapted to receive a printed circuit board and an electrical terminal respectively, an electrical terminal removably received in said second cavity, a rocker mounted in said body and extending into said first and second cavities with said rocker mounted for pivotal movement from an unlocking position to a locking position responsive to insertion of a printed circuit board into said first cavity, said rocker having a portion thereof movable in said second cavity, cooperable latch means on said terminal and said portion of said rocker for positively latching an electrical terminal in said second cavity when said rocker is in said locking position, and spring means extending along said rocker for electrically connecting a terminal and printed circuit board together and resiliently urging said rocker toward said unlocking position.

7. The printed circuit connector of claim 6 characterized further in that said spring means has a portion thereof received in said second cavity and positioned to engage and resiliently hold a terminal clip in said second cavity when said rocker is in said unlocking position.

8. The printed circuit connector of claim 6 in which a pair of said rockers are mounted in said body extending into said first and second cavities and positioned in opposition to each other for receiving a printed circuit board between them in said first cavity; one of said spring means extends along each of said rockers resiliently urging said rocker towards its unlocking position, and said rockers have shoulder portions in said second cavities facing away from each other and engaging said body when said rockers are in said unlocking positions for limited movement of said spring means toward each other in said first cavity with said spring means at their closest limit of approach to each other being positioned out of contact with each other.

9. A printed circuit board connector comprising an insulator body having first and second cavities therein adapted to receive a printed circuit board and an electrical terminal respectively electrically connected together, a rocker mounted in said body and extending into said first and second cavities with said rocker mounted for pivotal movement in said body between a first position protruding substantially into said first cavity and a second position spaced outwardly of said first cavity from said first position, spring means for resiliently urging said rocker toward said first position but yieldable to permit movement of said rocker to said second position responsive to insertion of a printed circuit board into said first cavity, and latching means mounted on said rocker for movement through said second cavity to latch a terminal therein responsive to movement of said rocker from said first position to said second position.

10. A printed circuit connector comprising a body having first and second cavities for receiving a printed circuit board and an electrical terminal respectively, a rocker member mounted in said body for rocking movement about an axis between said cavities and extending into both of said cavities, and a spring extending between said cavities along one side of said rocker and having first and second end portions in said first and second cavities for contacting said board and terminal respectively and an intermediate portion resiliently engaging said rocker at a point between said axis and said second end portion.

11. The connector of claim 10 characterized further by the inclusion of a lip on said body in said first cavity engageable with said spring for limiting movement of said spring away from said rocker.

12. A printed circuit connector comprising a body having first and second cavities for receiving a printed circuit board and a pair of electrical terminals respectively, a pair of opposed rocker members mounted in said body for rocking movement about axes between said cavities with said rockers extending into both of said cavities and having complementary first and second opposed portions in said first and second cavities respectively movable toward each other responsive to movement of the portions in the other of said cavities away from each other, web means in said second cavity separating the portions of said rockers in said second cavity from each other, an electrical terminal in each of said second cavities adjacent to said web means, spring means extending between said cavities along each of said rockers for contacting one side of the board and one of the terminals with each spring means having a portion thereof in one of said second cavities resiliently engaging said web resiliently urging the rocker in said second cavity away from said web, an electrical terminal in said second cavity adjacent to each of said rockers and resiliently held against said web by said spring means, and cooperable latch means on each of said rockers and the electrical terminal adjacent thereto for latching said terminals in said second cavity responsive to movement of said second portions of said rockers toward said web while resiliently supporting one of the terminals against said web.

13. The connector of claim 12 characterized further in that a plurality of said pairs of opposed rocker members are constructed of an electrical insulating material and are mounted in said body with said pairs spaced apart from each other longitudinally of said axes and with corresponding ones of the rocker members of said pairs integrally formed with each other for simultaneous rocking movement about one of said axes, and each of said spring means is a metal spring mounted on one of said rockers.

References Cited by the Examiner

UNITED STATES PATENTS

| | | | |
|---|---|---|---|
| 2,301,447 | 11/1942 | Parker et al. | 339—205 |
| 2,664,734 | 1/1954 | McEneany | 339—91 X |
| 3,069,652 | 12/1962 | Greco | 339—176 |
| 3,086,189 | 4/1963 | Robbins | 339—176 |

FOREIGN PATENTS

| | | |
|---|---|---|
| 1,143,263 | 4/1957 | France. |

JOSEPH D. SEERS, *Primary Examiner.*

W. DONALD MILLER, *Examiner.*